United States Patent [19]
Murphy et al.

[11] Patent Number: 5,164,618
[45] Date of Patent: Nov. 17, 1992

[54] SUPERCONDUCTING GATE ARRAY CELLS

[75] Inventors: John H. Murphy, Churchill; Michael R. Daniel, Monroeville; John X. Przybysz, Penn Hills, all of Pa.

[73] Assignee: Westinghouse Electric Corp., Pittsburgh, Pa.

[21] Appl. No.: 744,732

[22] Filed: Aug. 14, 1991

[51] Int. Cl.$^5$ .......................................... H03K 19/195
[52] U.S. Cl. ................... 307/476; 307/306; 307/462
[58] Field of Search ............... 307/476, 462, 306, 277, 307/245; 505/832, 859, 861

[56] References Cited

U.S. PATENT DOCUMENTS 4,097,765  6/1978  Zappe ..................... 307/306 X
4,413,197  11/1983  Josephs et al. ................ 307/462

FOREIGN PATENT DOCUMENTS

0107640  7/1982  Japan .................... 307/306
0082533  4/1986  Japan .................... 307/476
0181322  7/1989  Japan .................... 307/462

Primary Examiner—Eugene R. LaRoche
Assistant Examiner—Son Dinh
Attorney, Agent, or Firm—R. P. Lenart

[57] ABSTRACT

Superconducting timed gate array cells for use in single-rail logic circuits are provided by adding inputs to modified variable threshold logic (MVTL) timed inverter circuits. Data signals which are inphase with a first phase of a power source are coupled to gate array cells in which Josephson junction bias current is provided by a second phase of the power source. NOR, NAND, 2NOR-OR and 2NAND-AND circuits are disclosed for use as building blocks in the production of specialized digital logic circuits.

19 Claims, 4 Drawing Sheets

SUPERCONDUCTING GATE ARRAY CELLS

BACKGROUND OF THE INVENTION

This invention relates to superconducting digital electronic circuits and, more particularly, to superconducting gate array cells.

Superconducting digital logic gates which utilize Josephson junctions have been under investigation for a number of years. One family of superconducting logic gates known as modified variable threshold logic (MVTL) gates, has been successfully used to construct various types of superconducting digital devices. Examples of such devices can be found in Fujimaki et al., "Josephson 8-Bit Shift Register", IEEE Journal of Solid State Circuits, Vol. SC-22, No. 5, October 1987, and Fujimaki et al., "Josephson Pseudorandom Bit-Sequence Generator", IEEE Journal of Solid State Circuits, Vol. 23, No. 3, June 1988. These references utilize an MVTL OR gate which has the advantage of a wide operating margin while occupying a relatively small cross-sectional area. In this gate, if a logic 1 is applied to either or both input lines, then a logic 1 is produced at an output line, otherwise a logic 0 is produced. This condition holds for positive logic in which TRUE=1 and FALSE=0. For negative logic in which TRUE=1 and FALSE=0, an AND gate is produced. In each case, the input, output and bias signals are in phase signals. If the bias for the circuit is supplied from a leading phase power supply relative to the input signal, then the circuit not only performs the desired logic function, but the output signal is shifted relative to the input signal.

Since an inphase inverter gate cannot be fabricated using Josephson junction technology, MVTL OR and AND gates have been used in dual-rail circuits. By combining two MVTL OR gates with an unbuffered AND gate, a standard cell for rapidly prototyping superconducting dual-rail logic circuits has been produced as shown in the above-cited references. This cell has been used to build numerous digital circuits, all implemented in dual-rail logic.

Although an inphase inverter cannot be made using Josephson junction technology, a timed inverter has been constructed as shown in the above references. With the timed inverter, an input signal is provided inphase with a first phase of a power supply and an output signal is produced which is inphase with a second phase of the power supply. This inverter has been used to implement dual-rail logic by generating an inverted signal and synchronizing the main signal with the inverted signal using an MVTL OR gate powered by the second phase of the power supply.

Dual-rail logic circuits can have twice the amount of circuitry required in single-rail equivalents. However, to implement single-rail logic, signal inversion must be accomplished. It would be desirable to achieve. NOR and NAND functions in single-rail circuits which can be used to construct various logic circuits.

SUMMARY OF THE INVENTION

This invention provides superconducting digital gate array cells which can be operated in single-rail logic circuits. A superconducting timed NOR gate constructed in accordance with this invention includes a modified variable threshold logic inverter having a data input node for receiving a first data signal and an output terminal. A second input is provided for supplying a second data signal to the data input node. The input signals are inphase with a first phase of the circuit power source while the bias current for the inverter is inphase with a second phase of the power source.

Superconducting timed NAND gates constructed in accordance with this invention include a modified variable threshold logic inverter having a first data input circuit for receiving a first data signal and an output terminal. The first data input circuit includes a series connection of a pair of resistors between a bias voltage supply and a current sink. A third resistor is connected between an input terminal and a junction point between the pair of resistors, and a first Josephson junction is connected between the junction point and an input note of the inverter. A second data input circuit includes the series connection of an additional pair of resistors between the bias voltage supply and the current sink. Yet another resistor is connected between a second input terminal and the junction point between the additional resistors. A second Josephson junction is connected between that junction point and the input node of the inverter. Here again, input signals applied to the input terminals are inphase with a first phase of the circuit power source while the bias current for the circuit is supplied by a second phase of the power source.

Additional gate array cells are constructed by combining the above described NOR and NAND gates. The resulting cells can be used in single-rail logic circuits. They represent standard cells which shift phases between the inputs and outputs. The methods of achieving specific logic functions performed by the above gates and gate array cells are also encompassed by this invention. This approach increases the speed of computation. For example in a three-phase powered circuit, instead of waiting two cycles for a result, a result is obtained in two-thirds of a cycle.

BRIEF DESCRIPTION OF THE DRAWINGS

The present invention will be more readily apparent to those skilled in the art from the following description of the preferred embodiments thereof, as shown in the accompanying drawings wherein.

DESCRIPTION OF THE PREFERRED EMBODIMENTS

Figure 1:
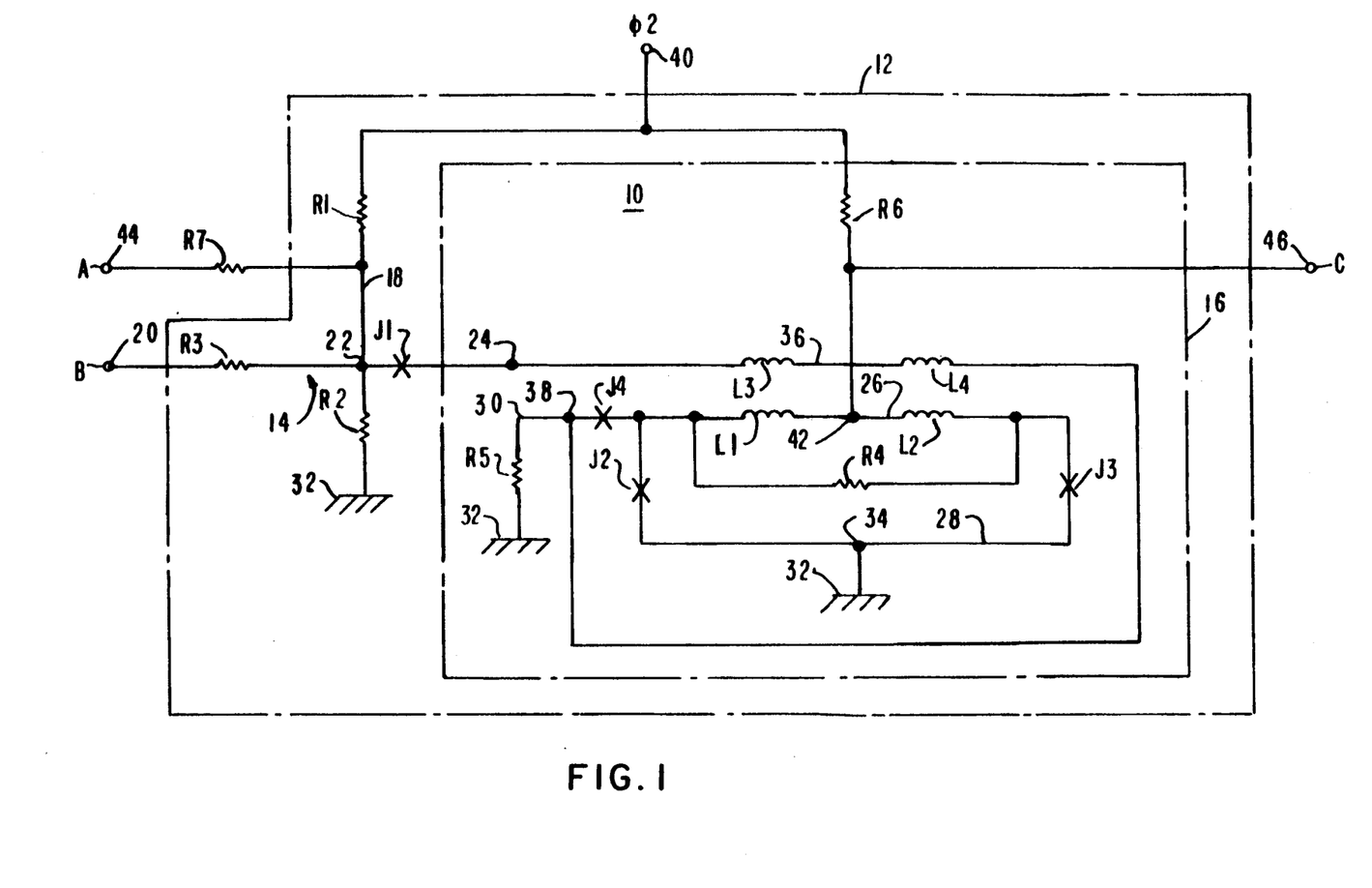
FIG. 1 is a schematic diagram of an MVTL timed NOR gate.

Referring to the drawings, Figure is a schematic diagram of an MVTL timed NOR gate 10, constructed in accordance with the present invention. This NOR gate includes a timed inverter circuit 12 which is constructed in accordance with circuits disclosed in the above-cited references. The timed inverter 12 includes an input circuit 14 and an MVTL OR circuit 16. The input circuit 14 is seen to include a circuit branch 18 comprising the series connection of resistors R1 and R2. A third resistor R3 is connected between an input terminal 20 and a junction point 22 between resistors R1 and R2. Josephson junction J1 connects junction point 22 to an input node 24 in OR circuit 16. The OR circuit includes a circuit branch 24 comprising the series connection of inductors L1 and L2. Circuit branch 26 is electrically connected in parallel with circuit branch 28 comprising the series connection of Josephson junctions J2 and J3. Resistor R4 is also connected in parallel with circuit branch 26. An additional circuit branch 30 comprising the series connection of resistor R5 and Josephson junction J4 is connected between a current sink 32 and one end of circuit branches 26 and 28. The current sink 32 is also connected to a junction point 34 between Josephson junctions J2 and J3.

An additional circuit branch 36 comprising the series connection of inductors L3 and L4 is connected between the input node 24 and a junction point 38 in circuit branch 30. All of the elements which have been described so far can be found in existing timed inverter MVTL circuits. The required currents for biasing the various Josephson junctions are supplied by applying phase two of a power source to a power input terminal 40. That terminal is connected to one end of circuit branch 18, and is further connected to a junction point 42 between inductors L1 and L2 by way of resistor R6. To obtain the NOR gate of FIG. 1, an additional input terminal 44 is connected to junction point 22 in circuit branch 18 by way of resistor R7. By adding the second input line to the previous MVTL timed inverter, an MVTL timed NOR gate is produced. This NOR gate can be used in single-rail logic circuits. Since the circuits disclosed in the above-mentioned references emphasized dual-rail logic, this modification to the timed inverter circuit was not considered. Input data signals A and B supplied on terminals 20 and 44 are provided inphase with phase 1 of an external power supply and the output signal C on terminal 46 is inphase with phase 2 of the power supply. Analogous operation can be obtained by supplying the bias current from phase 3 or phase 1 if the input signals are inphase with the appropriate previous phase.

Figure 2:
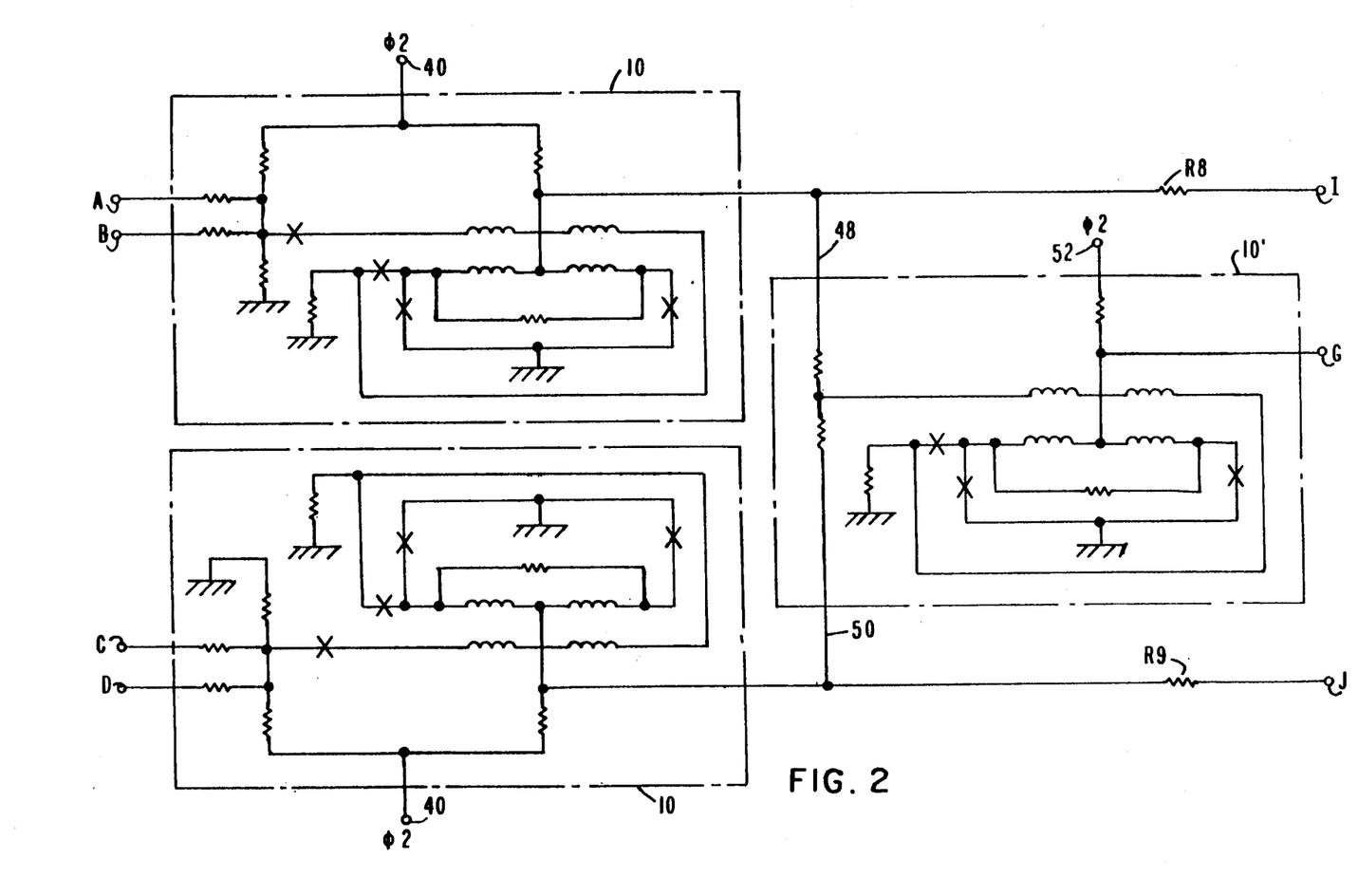
FIG. 2 is a schematic diagram of a timed 2NOR-OR gate.

A standard cell for building electronic circuits can be formed from the timed NOR gate of FIG. 1 as illustrated in FIG. 2. By combining two MVTL timed NOR gates 10 with an MVTL OR gate 10', a suitable standard cell for rapidly prototyping single-rail logic circuits is produced. Item 10' is an OR gate in FIG. 2 since its input signals on lines 48 and 50 are inphase with phase 2 of the power source which also supplies the bias currents for circuit 10' by way of bias current supply terminal 52. As a positive logic circuit, FIG. 2 provides the following logic functions.

$$\overline{(A+B)} + \overline{(C+D)} \text{ or equivalently } \overline{(A+B) \cdot (C+D)} \quad (1)$$

As a negative logic circuit, FIG. 2 produces:

$$\overline{(A \cdot B) \cdot (C \cdot D)} \text{ or equivalently } \overline{(A \cdot B)} + \overline{(C \cdot D)} \quad (2)$$

The input signals (A, B, C and D) are inphase with phase 1 of the power supply while the outputs (I, G and J) are inphase with phase 2 of the power supply. Analogous operation occurs when the circuit is powered by phase 3 or phase 1 power supplies. To obtain, a phase shifted output, or gate circuit 10' may be powered a power supply phase which lags phase 2.

Figure 3:
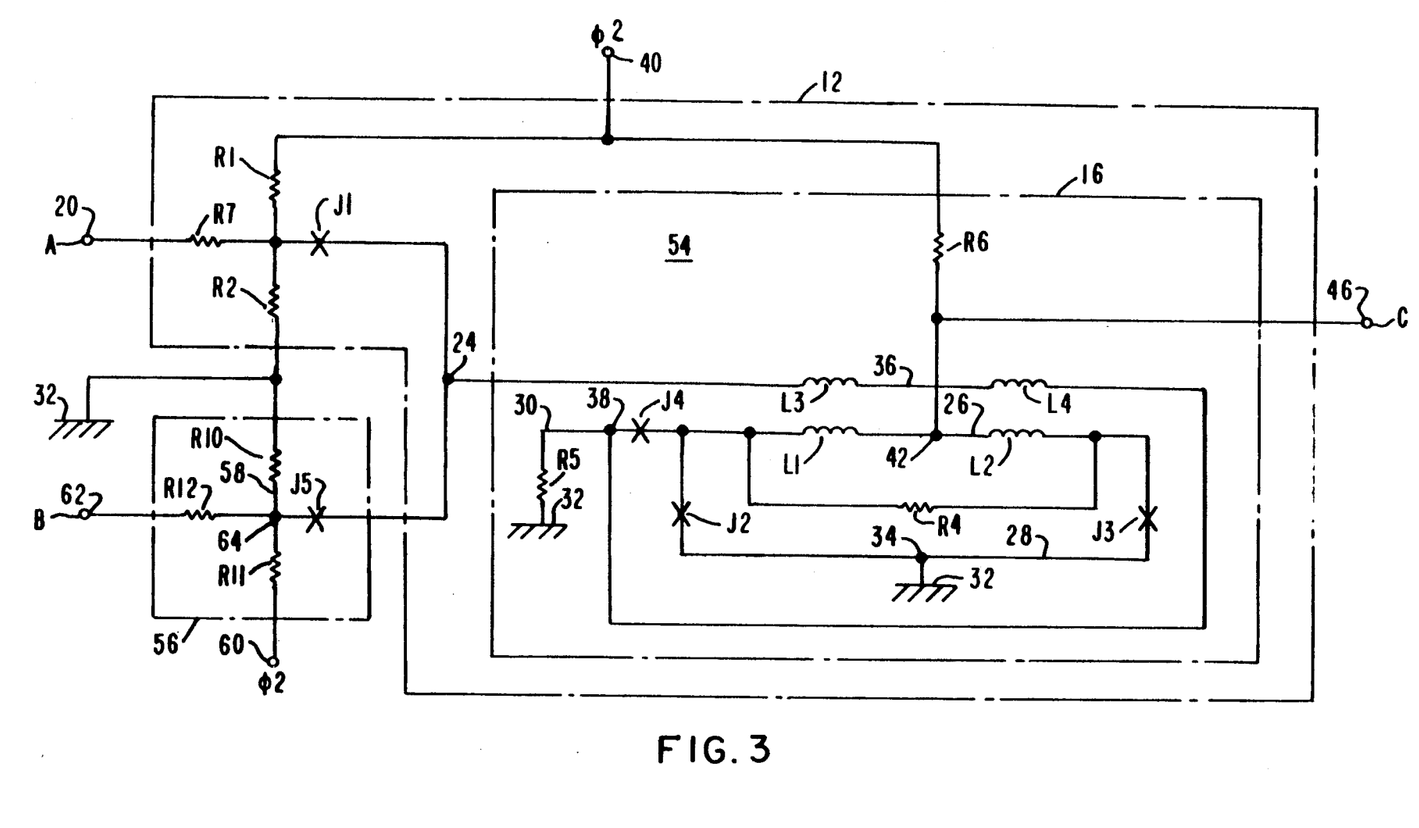
FIG. 3 is a schematic diagram of a timed NAND gate.

FIG. 3 is a schematic diagram of a NAND gate 54 constructed in accordance with this invention. Here again, this circuit utilizes the timed inverter 12 of FIG. 1. To obtain the NAND function, a second input line must be added in a way such that it inverts the second input signal before combining that signal with the first input signal. This is accomplished by adding an input circuit 56. Input circuit 56 includes a circuit branch 58 comprising the series connection of resistors R10 and R11. Circuit branch 58 is connected between a bias power source input terminal 60 and a current sink 32. Resistor R12 is connected between an input terminal 62 and a junction point 64 in circuit branch 58. Josephson junction J5 connects junction point 62 to node 24 in timed inverter circuit 12. In FIG. 3, input signals (A and B) are provided inphase with phase 1 of the power source. The output signal (C) is inphase with phase 2 of the power supply. Analogous operation occurs when power is supplied by phase 3 or phase 1 of the power supply.

Figure 4:
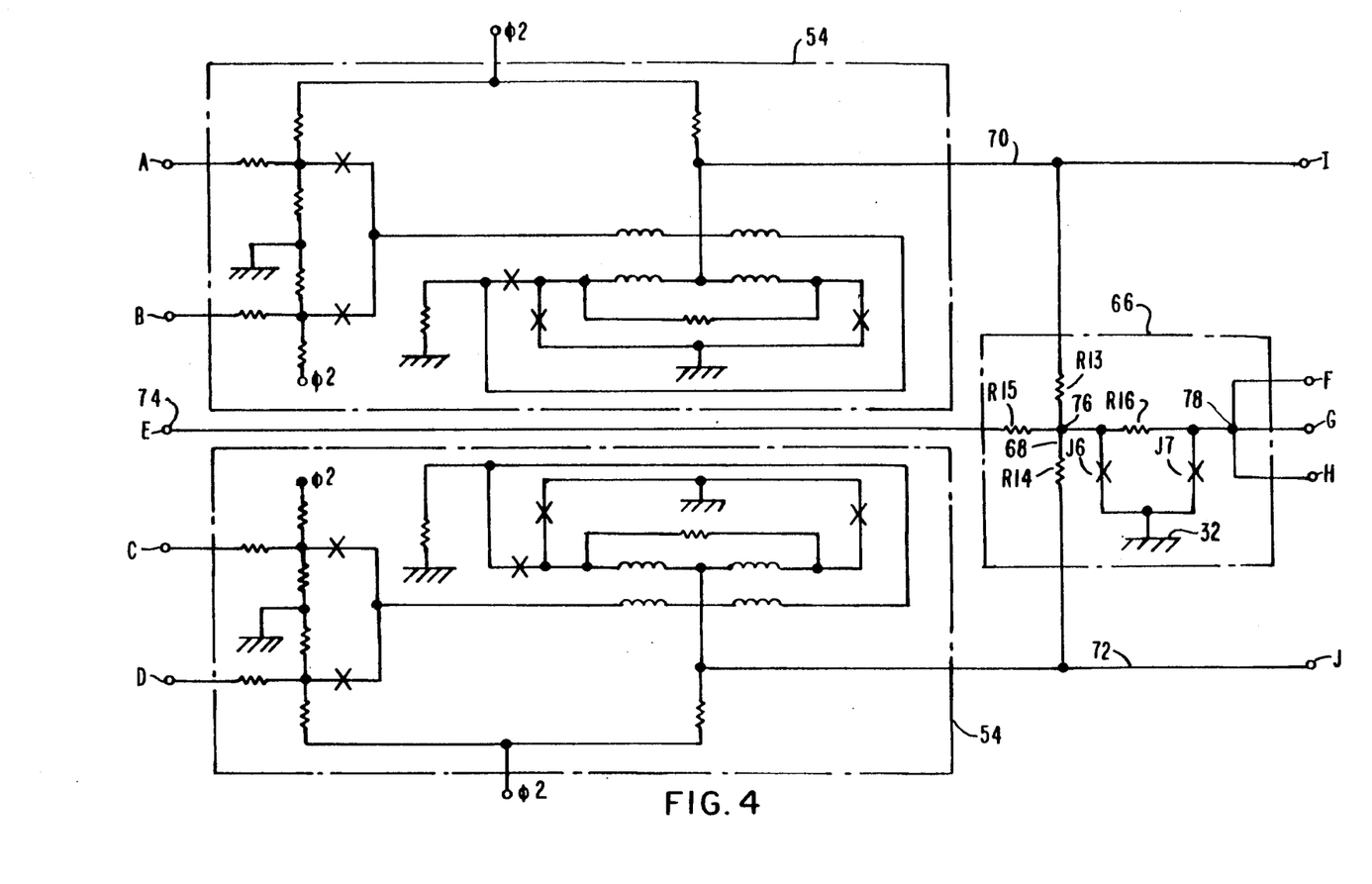
FIG. 4 is a schematic diagram of a timed 2NAND-AND gate.

A standard cell for building electronic circuits which utilizes the timed NAND gate of FIG. 3 is shown in FIG. 4. This cell combines two MVTL timed NAND gates 54 with an unbuffered two-thirds majority gate 66. The majority gate includes a circuit branch comprising the series connection of resistors R13 and R14 connected between output lines 70 and 72 of the two-timed NAND gates 54. An additional input terminal 74 is connected by way of resistor R15 to a junction point 76 in circuit branch 68. Resistor R16 connects junction point 76 to an output node 78. Josephson junctions J6 and J7 are used to connect opposite ends of resistor R16 to the current sink 32. With no E input on terminal 74, and when operating as a positive logic circuit, the circuit of FIG. 4 produces:

$$\overline{(A \cdot B) \cdot (C \cdot D)} \text{ or equivalently } \overline{(A \cdot B)} + \overline{(C \cdot D)} \quad (3)$$

As a negative logic circuit, it produces:

$$\overline{(A+B)} + \overline{(C+D)} \text{ or equivalently } \overline{(A+B) \cdot (C+D)} \quad (4)$$

The input signals (A, B, C, D and E) are provided inphase with phase one of the power supply. The output signals (F, G, H, I and J) are inphase with phase 2 of the power supply. Once again, analogous operation occurs when the circuit is powered by phase 3 or phase 1 of the power supply.

If two of the circuits of FIG. 4 are each powered by phase 2 of the power supply and the output signal (either I or J) from a NAND circuit in the first cell is fed into the input terminal 74 of the second cell, then a buffered two-thirds majority gate is formed. This feature makes the cell of FIG. 4 an excellent choice for implementing single-rail superconducting digital logic circuits. Analogous operation occurs when the circuit is powered by phase 3 or phase 1 of the power supplies.

It should now be apparent that this invention provides a unique approach to rapid prototyping of superconducting digital electronic circuits. Gate arrays constructed in accordance with this invention serve as universal Josephson junction gates. This technology permits the mass production of unpersonalized wafers for future use in fabricating personalized chips. Therefore, fabrication time for personalized chips can be reduced significantly.

In addition, the circuits of this invention do not utilize dual-rail logic. This design approach reduces circuit redundancy. To avoid the use of dual-rail logic, timed inverters are included in each gate array cell. This inclusion of a timed inverter increases the basic cell size by less than 30%. However, because the number of cells required to fabricate the circuit is reduced by up to 50% through dual-rail logic avoidance, a net savings can be made in the area occupied by the circuitry.

This invention creates universal NAND and NOR gates by multiple application of timed inverter circuits. These gates can be utilized as basic building blocks for fabricating arbitrary digital logic circuits. A key performance feature of this invention lies in its increased speed. For example, by using a three-phase power source, an output signal is produced in two-thirds of a cycle of the power source.

This invention also encompasses the methods of achieving the various logic functions performed by the circuits illustrated in the preferred embodiments.

For circuits powered by sources having more phases (e.g. 4, 5, etc.) the output signal may occur in one-half cycle or three-fourths cycle for a four phase source; or two-fifths, three-fifths or four-fifths of a cycle for a five phase source depending upon the circuit configuration. Although the invention has been described in terms of its preferred embodiments, it will be apparent to those skilled in the art that various changes may be made without departing from the scope of the invention. It is therefore intended that the appended claims cover such changes.

We claim:

1. A superconducting timed NOR gate comprising:
a modified variable threshold logic OR gate having a data input node, an output terminal, a power input terminal for connection to a power source, and a connection for a current sink;
a circuit branch including first and second resistors electrically connected in series with each other, said circuit branch being connected between said current sink and said power input terminal;
a Josephson junction electrically connected between said data input node and a junction point between said first and second resistors; and
means for applying at least two data signals to said junction point, said data signals being out-of-phase with voltage applied to said input terminal.

2. A superconducting timed NOR gate comprising:
a first circuit branch including first and second inductors electrically connected in series with each other;
a second circuit branch including first and second Josephson junctions electrically connected in series with each other;
said first and second circuit branches being electrically connected in parallel with each other;
means for connecting a junction point between said first and second Josephson junctions to a current sink;
means for applying a bias current to a junction point between said first and second inductors;
a third circuit branch including a first resistor and a third Josephson junction electrically connected in series with each other;
said third circuit branch being connected between said current sink and a junction point between said first inductor and said first Josephson junction;
a fourth circuit branch including second and third resistors electrically connected in series with each other;
said fourth circuit branch being connected between a power input terminal for connection to a power source and said current sink;
a fifth circuit branch including a fourth Josephson junction and third and fourth inductors electrically connected in series with each other;
said fifth circuit branch being connected between a junction point between said second and third resistors and a junction point between said first resistor and said third Josephson junction; and
means for applying at least two data input signals to said junction point between said second and third resistors, said data signals being out-of-phase with voltage applied to said power input terminal.

3. A superconducting timed 2NOR-OR gate comprising:
a first modified variable threshold logic inverter having a data input node for receiving a first data signal and an output terminal;
means for supplying a second data signal to said first modified variable threshold logic inverter data input node;
a second modified variable threshold logic inverter having a data input node for receiving a third data signal and an output terminal;
means for supplying a fourth data signal to said second modified variable threshold logic inverter data input node; and
a modified variable threshold logic OR gate for combining output signals on said first and second modified variable threshold logic inverter output terminals.

4. A superconducting timed, 2NOR-OR gate comprising:
a first modified variable threshold logic OR gate having a first data input node, a first output terminal, a first power input terminal for connection to a power source, and a first connection for a current sink;
a first circuit branch including first and second resistors electrically connected in series with each other, said first circuit branch being connected between said current sink and said first power input terminal;
a first Josephson junction electrically connected between said first data input node and a first junction point between said first and second resistors;
means for applying first and second data signals to said first junction point, said first and second data signals being out-of-phase with voltage applied to said first power input terminal;
a second modified variable threshold logic OR gate having a second data input node, a second output terminal, a second power input terminal for connection to said power source, and a second connection for said current sink;
a second circuit branch including third and fourth resistors electrically connected in series with each other, said second circuit branch being connected between said current sink and said second power input terminal;
a second Josephson junction electrically connected between said second data input node and a second junction point between said third and fourth resistors;
means for applying third and fourth data signals to said second junction point, said third and fourth data signals being out-of-phase with voltage applied to said first input terminal; and a third modified variable threshold logic OR gate for combining output signals from said first and second output terminals.

5. A superconducting timed NAND gate comprising:
a modified variable threshold logic inverter having a first data input circuit for receiving a first data signal and an output terminal;
said first data input circuit including a first circuit branch for connection between a power input terminal and a current sink, said first circuit branch including first and second resistors electrically connected in series with each other, a third resistor connected between a first junction point between said first and second resistors and a first input terminal, and a first Josephson junction connected between said first junction point and an input node; and
a second data input circuit including a second circuit branch for connection between said power input terminal and said current sink, said second circuit branch including fourth and fifth resistors electrically connected in series with each other, a sixth resistor connected between a second junction point between said fourth and fifth resistors and a second input terminal, and a second Josephson junction connected between said first junction point and said input node.

6. A superconducting timed NAND gate comprising:
a modified variable threshold logic OR gate having a data input node, an output terminal, a power input terminal and a connection for a current sink;
a first circuit branch including first and second resistors electrically connected in series with each other, said circuit branch being connected between said current sink and said power input terminal;
a first Josephson junction electrically connected between said data input node and a junction point between said first and second resistors;
a second circuit branch including third and fourth resistors electrically connected in series with each other, said circuit branch being connected between said current sink and said power input terminal;
a second Josephson junction electrically connected between said data input node and a junction point between said third and fourth resistors;
means for applying a first data signal to said junction point between said first and second resistors; and
means for applying a second data signal to said junction point between said third and fourth resistors, said first and second data signals being out-of-phase with voltage applied to said power input terminal.

7. A superconducting timed NAND gate comprising:
a first circuit branch including first and second inductors electrically connected in series with each other;
a second circuit branch including first and second Josephson junctions electrically connected in series with each other;
said first and second circuit branches being electrically connected in parallel with each other;
means for connecting a junction point between said first and second Josephson junctions to a current sink;
means for applying a bias current to a junction point between said first and second inductors;
a third circuit branch including a first resistor and a third Josephson junction electrically connected in series with each other;
said third circuit branch being connected between said current sink and a junction point between said first inductor and said first Josephson junction;
a fourth circuit branch including second and third resistors electrically connected in series with each other;
said fourth circuit branch being connected between a power input terminal and said current sink;
a fifth circuit branch including a fourth Josephson junction and third and fourth inductors electrically connected in series with each other;
said fifth circuit branch being connected between a junction point between said second and third resistors and a junction point between said first resistor and said third Josephson junction;
a sixth circuit branch including fourth and fifth resistors electrically connected in series with each other;
said sixth circuit branch being connected between said power source input terminal and said current sink;
a fifth Josephson junction being electrically connected between a junction point between said fourth and fifth resistors and a junction point between said fourth Josephson junction and said third inductor;
means for applying a first data input signal to said junction point between said second and third resistors;
means for applying a second data input signal to said junction point between said fourth and fifth resistors, said first and second data signals being out-of-phase with voltage applied to said power input terminal.

8. A superconducting timed 2NAND-AND gate comprising:
a first modified variable threshold logic inverter having a first data input circuit for receiving a first data signal and a first output terminal;
said first data input circuit including a first circuit branch for connection between a first power input terminal and a current sink, said first circuit branch including first and second resistors electrically connected in series with each other, a third resistor connected between a first junction point between said first and second resistors and a first input terminal, and a first Josephson junction connected between said first junction point and an input node;
a second data input circuit including a second circuit branch for connection between said power input terminal and said current sink, said second circuit branch including fourth and fifth resistors electrically connected in series with each other, a sixth resistor connected between a second junction point between said fourth and fifth resistors and a second input terminal, and a second Josephson junction connected between said second junction point and said input node;
a second modified variable threshold logic inverter having a third data input circuit for receiving a third data signal and a second output terminal;
said third data input circuit including a third circuit branch for connection between said power input terminal and a current sink, said third circuit branch including seventh and eighth resistors electrically connected in series with each other, a ninth resistor connected between a third junction point between said seventh and eighth resistors and a third input terminal, and a third Josephson junction connected between said third junction point and said input node;

a fourth data input circuit including a fourth circuit branch for connection between said power input terminal and said current sink, said fourth circuit branch including tenth and eleventh resistors electrically connected in series with each other, a twelfth resistor connected between a fourth junction point between said tenth and eleventh resistors and a fourth input terminal, and a fourth Josephson junction connected between said fourth junction point and said input node; and an AND circuit for combining output signals on said first and second output terminals of said first and second modified variable threshold logic inverters.

9. A superconducting timed 2NAND-AND gate comprising:

a first modified variable threshold logic OR gate having a data input node, an output terminal, a power source input terminal and a connection for a current sink;

a first circuit branch including first and second resistors electrically connected in series with each other, said circuit branch being connected between said current sink and said power source input terminal;

a first Josephson junction electrically connected between said first modified variable threshold logic OR gate data input node and a junction point between said first and second resistors;

a second circuit branch including third and fourth resistors electrically connected in series with each other, said circuit branch being connected between said current sink and said power source input terminal;

a second Josephson junction electrically connected between said first modified variable threshold logic OR gate data input node and a junction point between said third and fourth resistors;

means for applying a first data signal to said junction point between said first and second resistors, and for applying a second data signal to said junction point between said third and fourth resistors, said first and second data signals being out-of-phase with voltage applied to said power source input terminal;

a second modified variable threshold logic OR gate having a data input node, an output terminal, a power source input terminal, and a connection for a current sink;

a third circuit branch including fifth and sixth resistors electrically connected in series with each other, said circuit branch being connected between said current sink and said power source input terminal;

a third Josephson junction electrically connected between said second modified variable threshold logic OR gate data input node and a junction point between said fifth and sixth resistors;

a fourth circuit branch including seventh and eighth resistors electrically connected in series with each other, said fourth circuit branch being connected between said current sink and said power source input terminal;

a fourth Josephson junction electrically connected between said second modified variable threshold logic OR gate data input node and a junction point between said seventh and eighth resistors;

means for applying a second data signal to said junction point between said fifth and sixth resistors, said first and second data signals being out-of-phase with voltage applied to said power source input terminal; and an AND circuit for combining output signals on said output terminals of said first and second modified variable threshold logic OR gates.

10. A method of performing a NOR function, comprising the steps of:

supplying first and second data signals to an input terminal of a superconducting modified variable threshold logic inverter inphase with a first phase of a power source; and biasing said modified variable threshold logic inverter with a second phase of said power source, such that an output signal produced by said modified variable threshold inverter in response to said first and second data signals is inphase with said second phase of said power source.

11. A method of performing a NOR function, as recited in claim 10, wherein:

said second phase of said power source lags said first phase of said power source.

12. A method of performing a 2NOR-OR function, comprising the steps of:

supplying first and second data signals to a first input terminal of a first superconducting modified variable threshold logic inverter inphase with a first phase of a power source;

supplying third and fourth data signals to a second input terminal of a second superconducting modified variable threshold logic inverter inphase with said first phase of said power source;

biasing said first superconducting modified variable threshold logic inverter with a second phase of said power source, such that a first output signal produced by said first modified variable threshold inverter in response to said first and second data signals is inphase with said second phase of said power source;

biasing said second superconducting modified variable threshold logic inverter with said second phase of said power source, such that a second output signal produced by said second modified variable threshold inverter in response to said third and fourth data signals is inphase with said second phase of said power source; and combining said first and second output signals in a superconducting OR gate to produce a third output signal.

13. A method of performing a 2NOR-OR function, as recited in claim 12, wherein:

said second phase of said power source lags said first phase of said power source.

14. A method of performing a 2NOR-OR function, as recited in claim 13, wherein:

said superconducting OR gate is powered by said second phase of said power source.

15. A method of performing a 2NOR-OR function, as recited in claim 12, wherein:

said superconducting OR gate is powered by a phase of said power source which lags said second phase.

16. A method of performing a NAND function, comprising the steps of:

supplying a first data signal inphase with a first phase of a power source to a first input terminal of a first data input circuit of a superconducting modified variable threshold logic inverter, said first data input circuit including a first circuit branch for connection between a power input terminal and a current sink, said first circuit branch including first and second resistors electrically connected in series with each other, a third resistor connected between a first junction point between said first and second resistors and said first input terminal, and a first Josephson junction connected between said first junction point and an input node;

supplying a second data signal inphase with said first phase of said power source to a second input terminal of a second data input circuit of said superconducting modified variable threshold logic inverter, said second data input circuit including a second circuit branch for connection between said power input terminal and said current sink, said second circuit branch including fourth and fifth resistors electrically connected in series with each other, a sixth resistor connected between a second junction point between said fourth and fifth resistors and said second input terminal, and a second Josephson junction connected between said second junction point and said input node; and biasing said superconducting modified variable threshold logic inverter with a second phase of said power source, such that an output signal produced by said superconducting modified variable threshold logic inverter in response to said first and second data signals is inphase with said second phase of said power source.

17. A method of performing a NAND function, as recited in claim 16, wherein:
said second phase of said power source lags said first phase of said power source.

18. A method of performing a 2NAND-AND function, comprising the steps of:

supplying a first data signal inphase with a first phase of a power source to a first input terminal of a first data input circuit of a first superconducting modified variable threshold logic inverter, said first data input circuit including a first circuit branch for connection between a power input terminal and a current sink, said first circuit branch including first and second resistors electrically connected in series with each other, a third resistor connected between a first junction point between said first and second resistors and said first input terminal, and a first Josephson junction connected between said first junction point and a first input node;

supplying a second data signal inphase with said first phase of said power source to a second input terminal of a second data input circuit of said first superconducting modified variable threshold logic inverter, said second data input circuit including a second circuit branch for connection between said power input terminal and said current sink, said second circuit branch including fourth and fifth resistors electrically connected in series with each other, a sixth resistor connected between a second junction point between said fourth and fifth resistors and said second input terminal, and a second Josephson junction connected between said second junction point and said first input node;

biasing said first superconducting modified variable threshold logic inverter with a second phase of said power source, such that a first output signal produced by said first superconducting modified variable threshold logic inverter in response to said first and second data signals is inphase with said second phase of said power source;

supplying a third data signal inphase with said first phase of said power source to a third input terminal of a third data input circuit of a second superconducting modified variable threshold logic inverter, said third data input circuit including a third circuit branch for connection between said power input terminal and said current sink, said third circuit branch including seventh and eighth resistors electrically connected in series with each other, a ninth resistor connected between a third junction point between said seventh and eighth resistors and said third input terminal, and a third Josephson junction connected between said third junction point and a second input node;

supplying a fourth data signal inphase with said first phase of said power source to a fourth input terminal of a fourth data input circuit of said second superconducting modified variable threshold logic inverter, said fourth data input circuit including a fourth circuit branch for connection between said power input terminal and said current sink, said fourth circuit branch including tenth and eleventh resistors electrically connected in series with each other, a twelfth resistor connected between a fourth junction point between said tenth and eleventh resistors and said fourth input terminal, and a fourth Josephson junction connected between said fourth junction point and said second input node;

biasing said second superconducting modified variable threshold logic inverter with said second phase of said power source, such that a second output signal produced by said second superconducting modified variable threshold logic inverter in response to said third and fourth data signals is inphase with said second phase of said power source; and combining said first and second output signals in an AND circuit to produce a third output signal.

19. A method of performing a 2NAND-AND function, as recited in claim 19, wherein: said second phase of said power source lags said first phase of said power source.

* * * * *